United States Patent

Pirkle et al.

[11] Patent Number: 6,016,766
[45] Date of Patent: Jan. 25, 2000

[54] MICROWAVE PLASMA PROCESSOR

[75] Inventors: David R. Pirkle, Soquel; John Daugherty, Oakland; Michael Giarratano, Fremont; C. Robert Koemtzopoulos, Hayward; Felix Kozakevich, Sunnyvale, all of Calif.

[73] Assignee: Lam Research Corporation, Fremont, Calif.

[21] Appl. No.: 08/998,945

[22] Filed: Dec. 29, 1997

[51] Int. Cl.⁷ .................................................. C23C 16/00

[52] U.S. Cl. ........................ 118/723 MW; 118/723 MA; 156/345; 315/111.21; 315/111.41

[58] Field of Search ..................................... 118/723 MW, 118/723 MA; 156/345; 315/111.21, 111.41

[56] References Cited

U.S. PATENT DOCUMENTS

| | | | |
|---|---|---|---|
| 5,003,152 | 3/1991 | Matsuo | 219/121.59 |
| 5,111,111 | 5/1992 | Stevens | 315/111.41 |
| 5,115,167 | 5/1992 | Ootera | 315/111.21 |
| 5,179,264 | 1/1993 | Cuomo et al. | |
| 5,282,899 | 2/1994 | Balmashnov | 118/723 R |

Primary Examiner—Bruce Breneman
Assistant Examiner—Erin Fieler
Attorney, Agent, or Firm—Lowe Hauptman Gopstein Gilman & Berner

[57] ABSTRACT

Ionizable gas supplied to an electron cyclotron resonance vacuum plasma processor chamber for semiconductor wafers is excited to a plasma state by microwave energy coupled to the chamber. The level of microwave power reflected from the chamber controls the level of microwave power derived from a source driving the ionizable gas in the chamber.

16 Claims, 1 Drawing Sheet

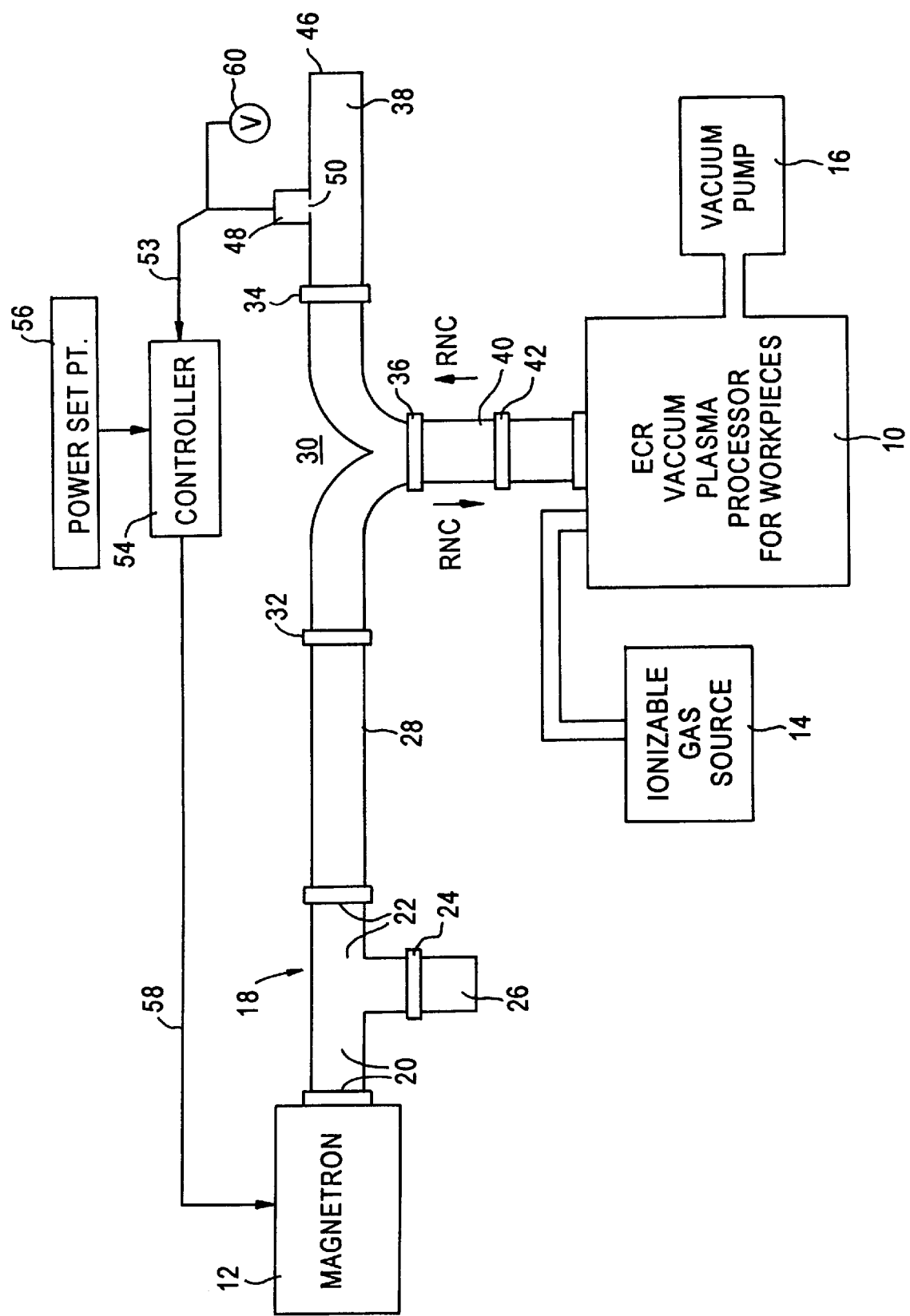

MICROWAVE PLASMA PROCESSOR

FIELD OF INVENTION

The present invention relates generally to processors for workpieces wherein a gas in a vacuum chamber is excited by microwaves to a plasma for processing the workpieces and more particularly to such a processor and a processing method wherein microwave power supplied to the chamber is controlled in response to microwave power reflected from the chamber.

BACKGROUND ART

Microwave excited plasmas are used for many different processes, e.g. plasma processing (etching or chemical vapor deposition) of workpieces, such as silicon wafers, diamond deposition onto a workpiece, plasma treating of coatings on a workpiece, ion implantation of workpieces, and implanting particles in workpieces. A microwave field supplied to a vacuum chamber responsive to ionizable gas interacts with the ionizable gas to form a plasma for processing the workpiece.

The microwave energy supplied to the chamber is typically derived from a relatively high power source, such as a magnetron having a rating of at least 1 kW. For certain types of operation, the vacuum chamber includes an electron cyclotron resonance structure including a DC magnetic field source. The magnetron often has a frequency of 2.45 GHz and the DC magnetic field in the chamber produces a magnetic field of 875 Oersteds. The stated frequency and DC magnetic field establish the electron cyclotron resonance phenomenon which is most efficient when circularly polarized microwave energy is supplied to the chamber. For other applications, the electron cyclotron resonance phenomenon is not needed and linearly polarized microwave fields are supplied to the cavity.

The microwave excited plasma absorbs significantly different amounts of microwave energy as a function of plasma conditions, such as its pressure, gas composition and gas flow, and the electric and magnetic fields coupled to and established in the plasma. These conditions, and therefore microwave power absorption by the plasma, vary as a function of time while a workpiece is being processed by the plasma. Hence, the plasma is a highly variable load for the microwave energy coupled to the chamber and absorbed by the plasma. Precautions must be taken to counteract the variability of microwave energy absorption by the plasma. Otherwise, a plasma excited by microwave energy is likely to be quite inconsistent and variable with regard to a number of parameters (particularly plasma flux density) as a function of time and space.

Prior art microwave power delivery devices for plasma and non-plasma loads have concentrated on matching the load to a microwave source. A reactive matching network, frequently referred to as a tuning network, is usually connected between a microwave source and the load. Typically, the reactive tuning network includes a waveguide including a three or four stub tuner or a sliding short circuit element. The tuning network transforms the impedance of the load to an impedance substantially equal to the impedance of the microwave source, as seen by looking from an output port of the microwave source into the tuning network. The tuning or matching network is automatically adjusted so substantially all the power from the microwave source goes into the load with little or no power reflected back to the source.

Non-plasma microwave loads driven by such sources and tuning networks are typically microwave antennas of radar systems, satellite systems and communications systems. Such loads are usually fairly well behaved, fairly well characterized and operate in a single microwave mode. However, plasma loads have much more dynamic impedances than the typical non-plasma load, making the plasma loads more difficult to characterize and more difficult to match to a microwave source. In addition, plasmas can and usually support many microwave modes, i.e., descriptions of the spatial microwave power distribution. As the microwave mode changes, due to changes in the plasma, the output of the microwave source is significantly affected.

Conventional microwave matching networks are susceptible to arcing and breakdown, particularly under the high power conditions encountered in driving a plasma load. Typically, a microwave source driving a plasma must produce at least 1 kW and in some instances has a requirement of up to 5 kW, power levels which frequently cause arcing and breakdown in the prior art microwave matching networks.

A typical microwave matching network senses power reflected from the plasma load. In response to the sensed reflected power, the microwave matching network adjusts the stub tuner or sliding short so the matching network reflects the same power as is supplied to it by the plasma, but with a 180° phase change. Thereby, the power reflected by the matching network cancels the power reflected back to the microwave source by the plasma load. This prior art structure inherently establishes substantial microwave standing waves between the microwave matching network and the plasma load. Hence, microwave energy frequently is reflected many times between the matching network and plasma load. Since the matching network is primarily reactive, the only significant loss in the system including the matching network and the plasma load is in the plasma.

In response to the plasma load changing, the load is not matched to the source and the plasma does not absorb a substantial amount of the energy supplied to it, causing the standing waves in the matching network to grow to a large amplitude. The standing waves in the matching network frequently distort the microwave mode applied to the plasma load, leading to unstable performance of the plasma, with deleterious effects on a processed workpiece. The increase in the standing waves greatly increases the risk of arcing in the waveguide connected between the microwave source and the plasma load. If arcing in the waveguide does not occur, the waveguide dissipates a substantial amount of energy, causing the waveguide to heat and absorb energy intended for the plasma load. As a result, the plasma load does not receive substantially all the output power of the microwave source. An operator of the system or an automatic controller has no way of knowing the plasma is receiving a reduced power level, without complicated monitoring equipment for losses in the microwave transmission system between the microwave generator and the load.

Cuomo et al., U.S. Pat. No. 5,179,264 discloses a solid state microwave oscillator for driving a plasma load in an electron cyclotron resonance cavity. Output power of the solid state oscillator is controlled by an optical pyrometer responsive to temperature of a test sample within a plasma processor microwave cavity. The optical pyrometer monitors power radiated by a sample in the chamber to produce a signal proportional to the temperature of the sample. As the temperature of the sample monitored by the optical pyrometer varies, there are proportionate increases and decreases in the optical pyrometer output. These changes in the output of the optical pyrometer control a bias voltage or circuit element in the oscillator to control the oscillator power output.

An apparent problem with the Cuomo et al. optical pyrometer technique for monitoring load conditions is that the plasma which surrounds the sample has a relatively high temperature. Consequently, the background of the environment to which the optical pyrometer is exposed appears to have a tendency to mask the temperature of the sample, which presumably is desirably at the same temperature as the processed workpiece. Consequently, the optical pyrometer would appear to have a very low signal to noise ratio output signal. The low signal to noise ratio output signal of the optical pyrometer would appear to prevent accurate control of the output power of the semiconductor microwave oscillator.

Accordingly, an object of the present invention is to provide a new and improved method of and apparatus for controlling microwave power supplied to a microwave excited vacuum plasma processor for a workpiece.

Another object of the invention is to provide a new and improved relatively simple method of and apparatus for inexpensively and reliably controlling microwave power supplied to a microwave excited plasma processor for a workpiece, wherein the arrangement has highly reproducable results from one workpiece to another.

An additional object of the present invention is to provide a new and improved method of and apparatus for supplying microwave excitation to a vacuum plasma processor that can handle a broad range of plasma impedances and provide control of the power supplied to the processor without having moving parts.

An additional object of the invention is to provide a new and improved method of and apparatus for controlling microwave power supplied to a microwave excited plasma processor, wherein a structure connected between a relatively high power microwave source and a plasma processor is not susceptible to arcing and/or breakdown.

An additional object of the invention is to provide a new and improved method of and apparatus for controlling microwave power for exciting a plasma in a vacuum processor for workpieces, wherein microwave power supplied by the source to the plasma is applied directly to the load without reflecting back and forth a plurality of times in a matching network having variable reactances.

An additional object of the invention is to provide a new and improved method of and apparatus for controlling power supplied by a microwave source to a microwave plasma processor for a load, wherein variations in the load, which have a tendency to affect the microwave operating wave mode and the impedance seen by the source are controlled rapidly, in a simple manner without moving parts.

An additional object of the invention is to provide a new and improved method of and apparatus for controlling microwave power supplied to a microwave vacuum plasma processor for a workpiece wherein control of the power is in response to an output signal having a high signal to noise ratio.

SUMMARY OF THE INVENTION

In accordance with one aspect of the invention, a plasma processor for a workpiece comprises a vacuum chamber responsive to an ionizable gas source for processing the workpiece with a plasma, a microwave source for exciting the gas in the chamber to a plasma, and a controller for microwave power supplied by the microwave source to the chamber responsive to microwave energy reflected from the chamber.

Another aspect of the invention concerns a method of processing a workpiece with a plasma in a vacuum plasma processing chamber supplied with an ionizable gas, wherein the gas is excited to a plasma by microwave energy and the microwave power supplied to the chamber is controlled in response to microwave energy reflected from the chamber. Preferably the level of microwave power supplied to the chamber, particularly the level of power derived by the microwave source, is controlled in response to the level of microwave power reflected from the chamber.

In the preferred embodiment, the chamber includes an electron cyclotron resonance structure, and the microwave energy coupled to the electron cyclotron resonance structure is circularly polarized in a first direction. The microwave source derives linearly polarized microwave energy converted by a polarizer into the circularly polarized microwave energy. The polarizer has an output for the microwave energy reflected from the chamber. The controller is responsive to the polarizer output.

The processor preferably includes a circulator having first and second ports coupled between the source and a first port of the polarizer. The circulator has a third port connected to a dummy load for absorbing substantially all the microwave energy incident on it. The circulator ports are arranged so microwave energy entering the first port from the source is coupled to the second port and microwave energy entering the second port from the circulator is coupled to the third port.

The polarizer includes an additional port for coupling the circularly polarized microwave energy to the chamber and responsive to circularly polarized microwave energy reflected from the chamber. The polarizer converts the circularly polarized microwave energy reflected from the chamber to linearly polarized microwave energy coupled to the polarizer output. A second dummy load coupled to the polarizer output absorbs substantially all the microwave energy incident on it.

A microwave power sensor coupled between the polarized output and the second dummy load derives a signal indicative of the level of microwave power flowing from the polarizer output to the another dummy load. The signal is supplied to the controller or can be monitored by an operator to control the microwave source output power.

BRIEF DESCRIPTION OF THE DRAWING

The sole figure is a combined block and circuit diagram of a preferred embodiment of the invention.

DESCRIPTION OF THE PREFERRED EMBODIMENT

The illustrated plasma processor preferably includes electron cyclotron resonance (ECR) vacuum plasma processor 10 responsive to microwave source 12, ionizable gas from source 14 and is evacuated to a suitable low pressure, such as $10^{-3}$ Torr, by vacuum pump 16. Vacuum chamber 10 includes a DC magnetic field source (not shown), typically producing a relatively high DC magnetic field such as 875 Oersteds. The microwave energy supplied by source 12 to chamber 10 typically has a frequency of 2.45 GHz and interacts with charge particles from source 14 to etch material from and/or deposit material onto workpieces (not shown) moved into and out of chamber 10. Typically, the workpieces are semiconductor wafers used for making integrated circuit chips.

Microwave source 12 is typically a magnetron capable of having an output power rating in the range of 1–5 kW. Control of the amount of power derived from the magnetron of source 12 is provided by adjusting the magnetron microwave current. The magnetron of source 12 derives a linearly polarized wave, typically having a $TE_{10}$ mode.

The microwave power derived from magnetron source 12 is preferably supplied to circulator 18 including inline ports 20 and 22 and port 24, at right angles to the inline ports. Power absorbing dummy load 26 is connected to port 24. Dummy load 26 has a value and properties such that it can handle the full output power of magnetron source 12 without damage or reflection and so virtually no energy coupled from circulator 18 through port 24 is reflected from the dummy load. Port 20 is connected directly to the output of magnetron 12, while port 22 is connected to rectangular waveguide 28, which propagates the same mode as is derived by the output of magnetron source 12. Output power from magnetron source 12 flows into circulator 18 through port 20, thence through port 22 into waveguide 28 having no stub tuners, sliding slots or any other moving parts. In fact there are no moving parts in the microwave source or its entire transmission system. Any power reflected from waveguide 28 through port 22 into circulator 18 flows through port 24 to dummy load 26 and is absorbed thereby. Since load 26 absorbs virtually all the energy incident on it, virtually no power is reflected back to the output port of magnetron 12.

While circulator 18 is preferably connected between magnetron source 12 and waveguide 28, the circulator can, under certain circumstances be eliminated to reduce cost. Circulator 18 protects magnetron 12 in the event of arcing or gross misalignment in waveguide 28, but is not necessary for proper operation of the apparatus illustrated in FIG. 1.

Proper operation of electron cyclotron resonance vacuum plasma processor 10 requires the microwave power supplied to the processor to be circularly polarized; typically, the microwave energy is circularly polarized in the right hand (i.e. clockwise) direction. Consequently, polarizer 30 (a passive microwave device) converts the linearly polarized output of waveguide 28 into a right hand circularly polarized wave. Polarizer 30 includes ports 32, 34 and 36, with ports 32 and 34 being somewhat in line with each other and port 36 being at right angles to ports 32 and 34. Port 32 is connected to the end of rectangular waveguide 28 opposite from the end of the waveguide connected to port 22 of circulator 18, while port 34 is connected to one end of rectangular waveguide 38. Port 36 of polarizer 30 is connected to one end of circular waveguide 40, the other end of which is connected to input port 42 of ECR processor 10.

Polarizer 30 converts the linearly polarized microwave energy coupled to port 32 thereof by waveguide 28 into right hand circularly polarized microwave energy that port 36 couples into waveguide 40, thence into processing chamber 10. The right hand circularly polarized energy coupled into port 42 of chamber 10 and the electron cyclotron resonance structure in cavity 10 excite the ionizable gas of source 14 into a plasma that treats, i.e., processes, the workpieces in vacuum chamber 10. Because the plasma is inherently unstable the plasma impedance is subject to unpredictable variations. Consequently, right hand polarized microwave energy reflects from the plasma through port 42 to waveguide 40. The reflected microwave energy flowing through waveguide 40 flows through port 36 of polarizer 30, thence to polarizer port 34. Polarizer 30 converts the right hand circularly polarized microwave energy reflected from the plasma and flowing through port 36 into linearly polarized microwave energy that flows through port 34 into waveguide 38.

In certain situations, chamber 10 does not include an electron cyclotron resonance DC magnetic field structure. For example, photoresist strippers do not require the swirling action of a plasma for effective operation. In those situations, linearly polarized microwave energy coupled into the vacuum plasma processing chamber effectively excites the ionizable gas to a suitable plasma. Consequently, in microwave vacuum plasma processors that do not include electron cyclotron resonance structures, a circulator of the same type as circulator 18 (a passive microwave device) is used instead of polarizer 30 to supply linearly polarized waves to the processor.

Waveguide 38 has a closed end 44 opposite from port 34. Dummy load 46 is placed in end 44 of waveguide 38. Load 46 has a value and characteristics such that it absorbs virtually all the power incident on it and virtually no power is reflected from it.

Power sensor 48, coupled to the interior of waveguide 38 by iris 50 in the waveguide wall, senses the microwave power reflected from the plasma of chamber 10. Sensor 48, a commercially available product, is protected from the high power level in waveguide 38 by the substantial attenuating effects (e.g. 54 db) of iris 50. Power sensor 48, typically a resistor which is heated in response to the power coupled through iris 50, derives a voltage directly proportional to the microwave power level reflected from chamber 10.

The output signal of power sensor 48, directly proportional to the reflected microwave power from chamber 10, is supplied by lead 52 to controller 54, also responsive to a set point for the load power of the plasma, as derived by signal source 56. The set point of source 56 is adjusted to a value commensurate with the desired microwave power to be supplied to the plasma in chamber 10 through waveguide 40. Controller 54 compares the outputs of sensor 48 and set point source 56 to derive an error signal which is supplied by lead 58 to control the current of magnetron microwave source 12. The current of magnetron source 12 is controlled in response to the signal on lead 58 so the desired power set point of source 56 is achieved in response to the indication of the microwave power level reflected from chamber 10 as monitored by sensor 58. While there has been described and illustrated one specific embodiment of the invention, it will be clear that variations in the details of the embodiment specifically illustrated and described may be made without departing from the true spirit and scope of the invention as defined in the appended claims. For example, the output power of magnetron 12 can be controlled manually by an operator monitoring voltmeter 60 connected to power sensor 48. Voltmeter 60 provides the operator with a visual indication of the microwave power level reflected from chamber 10 and coupled through polarizer 30.

What is claimed is:

1. A plasma processor for a workpiece comprising a vacuum chamber connected to be responsive to an ionizable gas source for processing the workpiece with a plasma, a microwave source for exciting the gas in the chamber to a plasma, and a controller for the level of microwave power derived by the source responsive to microwave energy reflected from the chamber for thereby controlling the amount of microwave energy supplied to the chamber.

2. A plasma processor for a workpiece comprising a vacuum chamber connected to be responsive to an ionizable gas source for processing the workpiece with a plasma, a microwave source for exciting the gas in the chamber to a plasma, and a controller for microwave energy supplied to the chamber responsive to microwave energy reflected from the chamber, the chamber including an electron cyclotron resonance structure so microwave energy from the microwave source being coupled to the electron cyclotron resonance structure to excite the gas to a plasma, the microwave energy coupled to the electron cyclotron resonance structure being circularly polarized in a first direction, the microwave source deriving linearly polarized microwave energy, and a polarizer coupled with the linearly polarized microwave energy for converting the linearly polarized microwave energy into the microwave energy that is circularly polarized in the first direction, the polarizer having an output for the microwave energy reflected from the chamber, the controller being responsive to the polarizer output.

3. The plasma processor of claim 2 wherein the controller controls the level of power supplied to the chamber in response to the level of microwave power reflected from the chamber.

4. The processor of claim 2 further including a circulator having first and second ports for coupling microwave energy from the source to a first port of the polarizer, the circulator having a third port connected to a dummy load for absorbing substantially all the microwave energy incident on it, the ports of the circulator being arranged so microwave energy entering the first port of the circulator from the source is coupled to the second port of the circulator and microwave energy entering the circulator via the second port of the circulator is coupled to the third port of the circulator.

5. The processor of claim 4 wherein the polarizer includes an additional port for coupling the circularly polarized microwave energy to the chamber and responsive to circularly polarized microwave energy reflected from the chamber, the polarizer converting the circularly polarized microwave energy reflected from the chamber to linearly polarized microwave energy coupled to the polarizer output, a second dummy load coupled to the polarizer output for absorbing substantially all the microwave energy incident on it.

6. The processor of claim 5 further including a microwave power sensor coupled between the polarizer output and the second dummy load for deriving a signal indicative of the level of microwave power flowing from the polarizer output to the second dummy load.

7. The processor of claim 2 wherein the polarizer includes a port for coupling the circularly polarized microwave energy to the chamber and responsive to circularly polarized microwave energy reflected from the chamber, the polarizer converting the circularly polarized microwave energy reflected from the chamber to linearly polarized microwave energy coupled to the polarizer output, a second dummy load coupled to the polarizer output for absorbing substantially all the microwave energy incident on it.

8. The processor of claim 7 further including a microwave power sensor coupled between the polarizer output and the second dummy load for deriving a signal indicative of the level of microwave power flowing from the polarizer output to the second dummy load.

9. The processor of claim 1 further including a circulator having first and second ports for coupling microwave energy from the source to a microwave structure coupled to a microwave input of the chamber, the circulator having a third port connected to a dummy load for absorbing substantially all the microwave energy incident on it, the ports of the circulator being arranged so microwave energy entering the circulator via the first port from the source is coupled to the second port and microwave energy entering the circulator via the second port is coupled to the third port.

10. A plasma processor for a workpiece comprising a vacuum chamber connected to be responsive to an ionizable gas source for processing the workpiece with a plasma, a microwave source for exciting the gas in the chamber to a plasma, and a controller for microwave energy supplied to the chamber responsive to microwave energy reflected from the chamber, a passive microwave device having a: (a) first port for supplying microwave energy to the chamber and responsive to microwave energy reflected from the chamber, (b) a second port responsive to microwave energy from the source for coupling microwave energy to the first port and substantially unresponsive to microwave energy reflected from the chamber to the first port, and (c) a third port responsive to microwave energy reflected from the chamber to the first port and substantially unresponsive to microwave energy coupled from the source to the second port.

11. The processor of claim 10 wherein the controller is responsive to microwave energy reflected from the chamber to the first port and which thence flows to the third port.

12. The processor of claim 11 further including a dummy load coupled to the third port for absorbing substantially all the microwave energy incident on the dummy load and flowing out of the passive microwave device through the third port.

13. The processor of claim 12 further including a microwave power sensor coupled between the third port and the dummy load for deriving a signal indicative of the level of microwave power flowing out of the passive microwave device through the third port to the dummy load.

14. A method of processing a workpiece with a plasma in a vacuum plasma processing chamber, ionizable gas in the chamber being response to microwave energy so the gas is excited to a plasma, comprising controlling the microwave energy supplied to the chamber by controlling the amount of microwave power derived by the source in response to the level of microwave energy reflected from the chamber.

15. The plasma processor of claim 11 wherein the controller controls the level of power supplied to the chamber in response to the level of microwave power reflected from the chamber.

16. The processor of claim 15 wherein the controller controls the level of microwave power derived by the source.

* * * * *